(12) United States Patent
Uchida et al.

(10) Patent No.: US 9,013,025 B2
(45) Date of Patent: Apr. 21, 2015

(54) INDUCTOR DEVICE AND SEMICONDUCTOR DEVICE

(71) Applicant: Renesas Electronics Corporation, Kawasaki-shi, Kanagawa (JP)

(72) Inventors: Shinichi Uchida, Kanagawa (JP); Yasutaka Nakashiba, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/148,893

(22) Filed: Jan. 7, 2014

(65) Prior Publication Data
US 2014/0210045 A1  Jul. 31, 2014

(30) Foreign Application Priority Data

Jan. 31, 2013 (JP) .................. 2013-017678

(51) Int. Cl.
| | | |
|---|---|---|
| H01L 27/08 | (2006.01) | |
| H01F 21/12 | (2006.01) | |
| H01L 49/02 | (2006.01) | |
| H01L 23/64 | (2006.01) | |

(52) U.S. Cl.
CPC ............... *H01F 21/12* (2013.01); *H01L 28/10* (2013.01); *H01L 23/645* (2013.01)

(58) Field of Classification Search
CPC ............... H01L 28/10; H01L 23/5227; H01L 2224/48091; H01L 23/645; H01L 2924/19042; H01L 2924/1206

USPC .......................... 257/277, 528, 531, E21.022
See application file for complete search history.

(56) References Cited

U.S. PATENT DOCUMENTS

| 6,556,416 B2 * | 4/2003 | Kunihiro ...................... 361/277 |
|---|---|---|
| 2004/0188785 A1 * | 9/2004 | Cunningham et al. ........ 257/415 |
| 2008/0247115 A1 * | 10/2008 | Lee et al. ..................... 361/277 |

FOREIGN PATENT DOCUMENTS

JP  08-204139 A  8/1996

OTHER PUBLICATIONS

Okada, K., et al., "Reconfigurable RF CMOS Circuit Using On-Chip MEMS Variable Inductor", IEICE Technical Report ED2005-116 OME2005-42, Sep. 2005, pp. 45-50.

* cited by examiner

*Primary Examiner* — Eduardo A Rodela
(74) *Attorney, Agent, or Firm* — Miles & Stockbridge P.C.

(57) ABSTRACT

An inductor device includes an insulation layer, an inductor, fixed electrodes, and a movable electrode. The inductor is formed on the insulation layer. The fixed electrodes are provided in positions which do not overlap with the inductor in a planar view. The movable electrode overlaps with the inductor and the fixed electrodes in the planar view, and is separated from the inductor and the fixed electrodes. Further, the movable electrode includes first openings.

9 Claims, 12 Drawing Sheets

INDUCTOR DEVICE AND SEMICONDUCTOR DEVICE

This application is based on Japanese Patent Application No. 2013-017678, the content of which is incorporated hereinto by reference.

BACKGROUND

1. Technical Field

The invention relates to an inductor device and a semiconductor device and relates to, for example, a technology which can be used for an inductor device, in which an inductance value is variable, and a semiconductor device.

2. Related Art

An inductor is an element which is important in configuring an analog circuit, for example, a wireless communication circuit. In recent years, a wireless communication circuit which handles a plurality of frequency bands is desired. In order to realize such a wireless communication circuit, it is desirable to cause the inductance value of an inductor to be variable. In contrast, for example, research by Kenichi Okada et al., "Reconfigurable RF Circuit Technology Using MEMS Variable Inductor", IEICE Technical Report ED2005-116 OME2005-42 discloses that it is possible to change the inductance value of an inductor by vertically moving a conductor plate which is disposed on the upper side of the inductor.

In addition, Japanese Unexamined Patent Application Publication No. 8-204139 discloses a technology below. First, an insulation layer is formed on a substrate, and an inductor and fixed electrodes are formed on the insulation layer. Further, a movable electrode is disposed to cover the inductor and the fixed electrodes. The ends of the movable electrode are curved toward the substrate and are fixed to the substrate.

In a technology disclosed in Japanese Unexamined Patent Application Publication No. 8-204139, the inductance value of an inductor is determined based on the distance between the movable electrode and the inductor. Therefore, it is necessary to control the distance between the movable electrode and the inductor with high precision. However, in a case of a plate shape, such as a conductor plate, it is difficult to perform vertical operation using an actuator due to air resistance or the delay of an operation occurs. Due to such malfunction and delay, defects occur with regard to control of a variable inductor, and thus circuit characteristics deteriorate. Other problems and new characteristics will be apparent based on the description of the specification and the accompanying drawings.

SUMMARY

In one embodiment, a movable electrode overlaps with an inductor and fixed electrodes in a planar view. Further, the movable electrode includes first openings.

According to the embodiment, it is possible to suppress the vertical operation of the movable electrode from being difficult or the delay of the operation of the movable electrode from occurring.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments will be described with reference to the accompanying drawings. Also, the same reference numerals denote the same components in all of the drawings, and the description thereof will not be repeated.

First Embodiment

Figure 1:
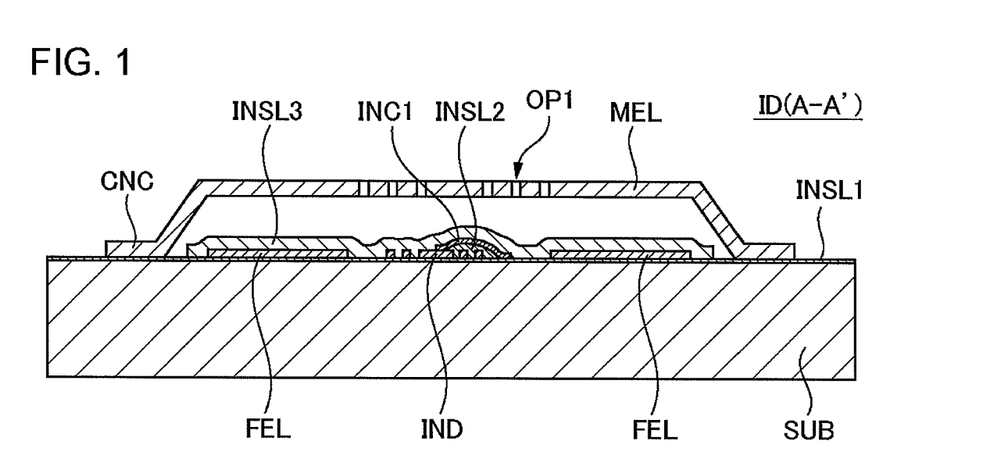
FIG. 1 is a cross-sectional view illustrating the configuration of an inductor device according to a first embodiment.
Figure 2:
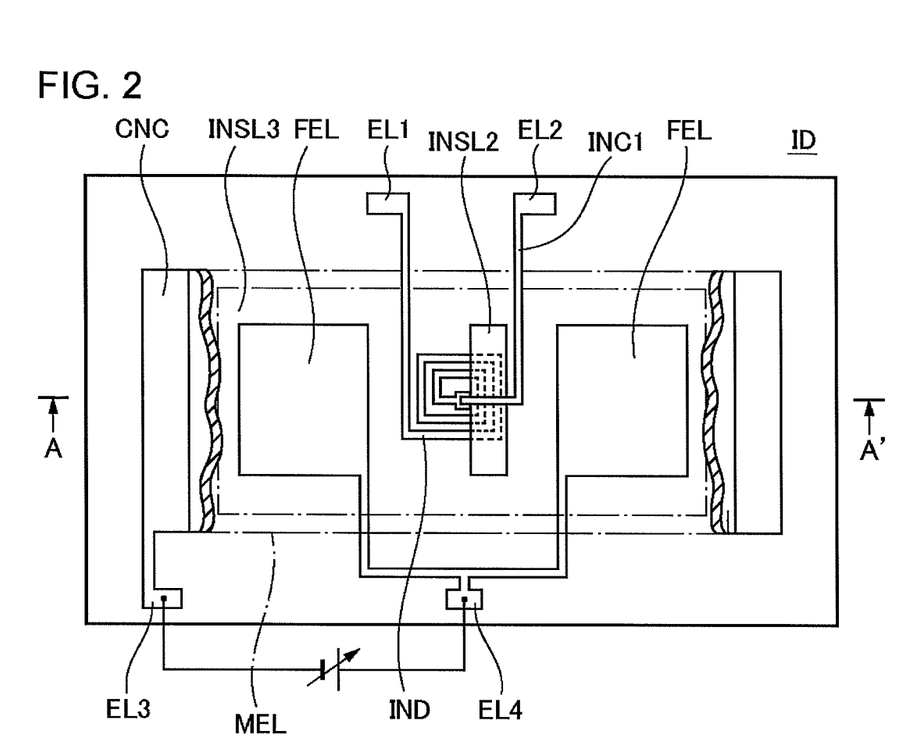
FIG. 2 is a plane view illustrating the inductor device.

FIG. 1 is a cross-sectional view illustrating the configuration of an inductor device ID according to a first embodiment. FIG. 2 is a plane view illustrating the inductor device ID. Meanwhile, in FIG. 2, a part of the configuration of the inductor device ID is fractured for explanation. In addition, FIG. 1 corresponds to a cross-section taken along a line A-A' of FIG. 2. The inductor device ID according to the embodiment includes an insulation layer INSL1, an inductor IND, fixed electrodes FEL, and a movable electrode MEL. The inductor IND is formed on the insulation layer INSL1. The fixed electrodes FEL are provided in positions which do not overlap with the inductor IND in a planar view. The movable electrode MEL overlaps with the inductor IND and the fixed electrodes FEL in the planar view, and is separated from the inductor IND and the fixed electrodes FEL. Further, the movable electrode MEL includes first openings OP1. Therefore, when the movable electrode MEL is moved, air resistance which is applied to the movable electrode MEL decreases. Accordingly, it is possible to suppress the vertical operation of the movable electrode from being difficult or the delay of the operation of the movable electrode from occurring. Hereinafter, the details will be described.

First, the configuration of the inductor device ID will be described with reference to FIG. 1. A substrate SUB is, for example, a semiconductor substrate such as silicon. However, the substrate SUB may be an insulation substrate such as glass or resin. In this case, the insulation layer INSL1 is not necessary. That is, the substrate SUB is substituted for the insulation layer INSL1.

Although the insulation layer INSL1 is, for example, a silicon oxide film, the insulation layer INSL1 may be another insulation film such as a silicon nitride film. Although the insulation layer INSL1 is formed using, for example, a thermal oxidation method, the insulation layer INSL1 may be formed using a deposition method or an application method.

Both the inductor IND and the fixed electrodes FEL are formed on the insulation layer INSL1. Since the inductor IND and the fixed electrodes FEL are formed by the same process, both are formed of the same material, for example, Cu or Al.

A part of the inductor IND (except a center) is covered by an insulation layer INSL2. The insulation layer INSL2 is, for example, a silicon nitride film or a silicon oxide film, and is formed using a deposition method, such as a CVD method, or an application method. A wiring INC1 is formed on the insulation layer INSL2. One end of the wiring INC1 is connected to the center of the inductor IND, and the other end of the wiring INC1 is positioned on the outside of the inductor IND in a planar view. That is, the center of the inductor IND is drawn to the outside of the inductor IND by the wiring INC1. The wiring INC1 is formed of, for example, Cu or Al.

The inductor IND, the fixed electrodes FEL, the insulation layer INSL2, and the wiring INC1 are covered by an insulation layer INSL3. The insulation layer INSL3 is, for example, a silicon nitride film or a silicon oxide film.

The movable electrode MEL is formed of a conductor film such as metal film. Although a material which configures the movable electrode MEL is, for example, Cu, Ni, or Al, another material may be used. The cross-sectional shape of the movable electrode MEL is substantially a trapezoid, the base of which is removed. In other words, the movable electrode MEL has a shape in which both ends of the conductor plate facing each other are bent toward the substrate SUB and both the ends are fixed to the substrate SUB. Meanwhile, at least one of the both ends of the movable electrode MEL is a connecting section CNC in order to apply a driving signal (voltage) to the movable electrode MEL. Further, when the driving signal is not applied, the movable electrode MEL is separated from the insulation layer INSL3.

In addition, as described above, the first openings OP1 are formed in the movable electrode MEL. The planar layout of the first openings OP1 will be described later.

Subsequently, the configuration of the inductor device ID is described with reference to FIG. 2. In an example shown in the drawing, a plurality of the fixed electrodes FEL are formed on the insulation layer INSL1. It is preferable that the plurality of fixed electrodes FEL be disposed in line symmetrical or point symmetrical positions based on the center of the movable electrode MEL in a planar view. If so, power which is generated between the fixed electrodes FEL and the movable electrode MEL is applied to the movable electrode MEL in a substantially uniform state.

In addition, electrodes EL1, EL2, EL3, and EL4 are provided on the insulation layer INSL1. The electrodes EL1, EL2, EL3, and EL4 are terminals in order to connect various signals to the inductor device ID, and all of them are positioned closer to the edge of the substrate SUB than the inductor IND, the fixed electrodes FEL, and the connecting section CNC in a planar view. Further, the electrode EL1 is connected to an end of the peripheral side of the inductor IND, and the electrode EL2 is connected to an end of the central side of the inductor IND through the wiring INC1. The electrode EL3 is connected to the connecting section CNC, and the electrode EL4 is connected to the fixed electrodes FEL.

Meanwhile, the electrodes EL1 and EL4 and a wiring which is connected thereto are formed by, for example, the same process as for the inductor IND and the fixed electrodes FEL. The electrode EL3 and a wiring which is connected thereto is formed by, for example, the same process as the movable electrode MEL. In addition, the electrode EL2 and the wiring INC1 are formed by a process which is different from the above-described process.

Figure 3:
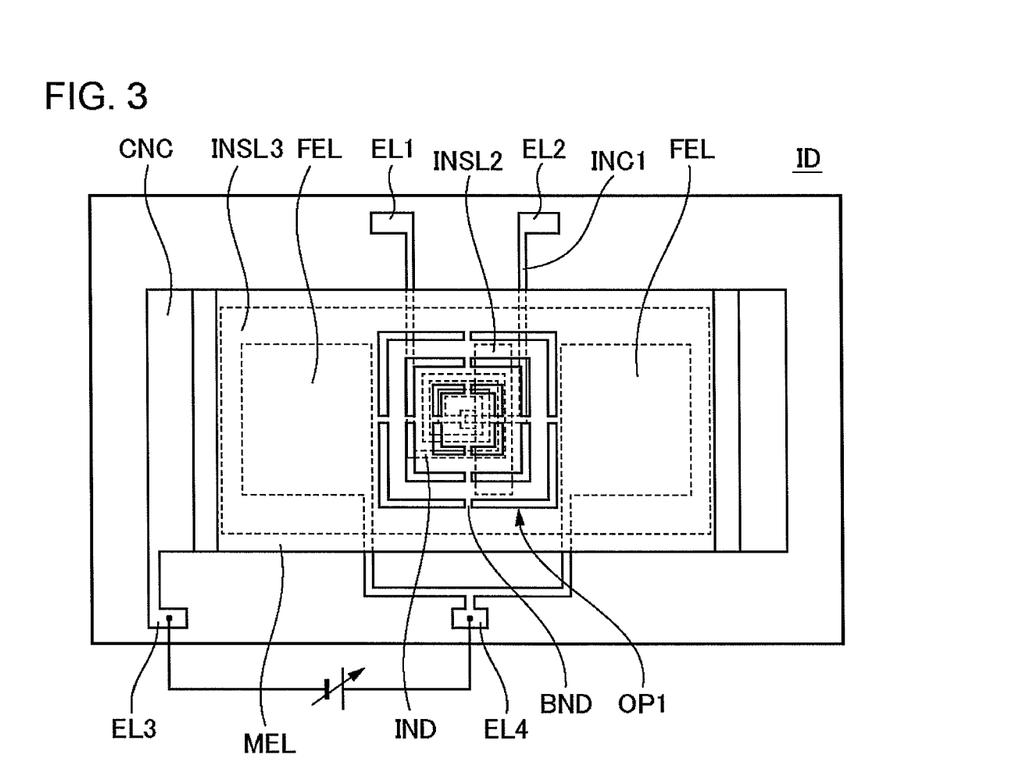
FIG. 3 is a view illustrating the planar layout of first openings.

FIG. 3 is a view illustrating the planar layout of the first openings OP1. The first openings OP1 are provided in the movable electrode MEL. In an example shown in the drawing, the first openings OP1 are provided in a position which overlaps with the inductor IND. In detail, the first openings OP1 are provided along the edges of the polygons (preferably, regular polygons: squares in the example shown in the drawing) which are concentric to the inductor IND. However, some of the edges of the polygons do not configure the first openings OP1 but configure a support section BND in order to designate the inside regions of the first openings OP1. In detail, the support section BND is provided at the center of each of the edges of the polygons.

In addition, in the example shown in the drawing, the first openings OP1 are provided in a multiplexed manner. The polygons which are formed with the first openings OP1 of the respective edges may be similar to each other (quadrangles such as squares or rectangles in the example shown in the drawing) or at least one of them may have a shape which is different from others.

Subsequently, an example of a method of manufacturing the inductor device ID will be described with reference to FIGS. 4A to 5B.

Figure 4A:
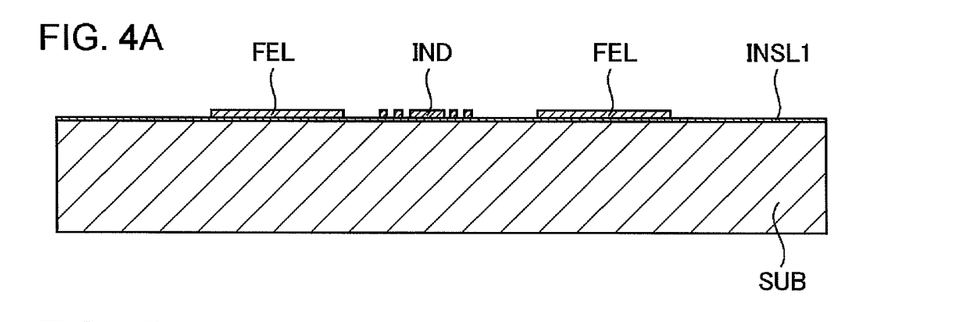
FIGS. 4A to 4C are views illustrating an example of an inductor device manufacturing method.

First, as shown in FIG. 4A, the insulation layer INSL1 is formed on the substrate SUB. As described above, the insulation layer INSL1 is formed using, for example, a thermal oxidation method, a deposition method, or an application method. Subsequently, a conductive film is formed on the insulation layer INSL1. The conductive film is formed using, for example, a CVD method, a sputtering method, or an application method. Subsequently, a resist pattern (not shown in the drawing) is formed on the conductive film, and the conductive film is etched using the resist pattern as a mask. Therefore, the inductor IND, the fixed electrodes FEL, the electrodes EL1 and EL4, a wiring which connects the inductor IND with the electrode EL1, and a wiring which connects the fixed electrodes FEL with the electrode EL4 are formed on the insulation layer INSL1. Thereafter, the resist pattern is removed.

Figure 4B:
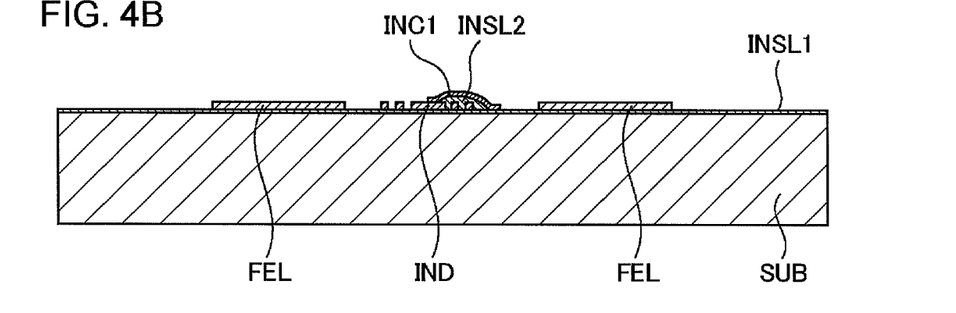

Subsequently, as shown in FIG. 4B, the insulation layer INSL2 is formed on the insulation layer INSL1, the inductor IND, the fixed electrodes FEL, the electrodes EL1 and EL4, and each of the wirings. The insulation layer INSL2 is formed using, for example, a deposition method or an application method. Subsequently, a resist pattern (not shown in the drawing) is formed on the insulation layer INSL2, and unnecessary portions of the insulation layer INSL2 are removed using the resist pattern as a mask. Thereafter, the resist pattern is removed. Subsequently, the wiring INC1 and the electrode EL2 are formed. The wiring INC1 and the electrode EL2 are formed to have a desired pattern using an evaporation method in which, for example, a mask is used. However, the wiring INC1 and the electrode EL2 may be formed to have the desired pattern using an etching method in which a resist pattern is used.

Figure 4C:
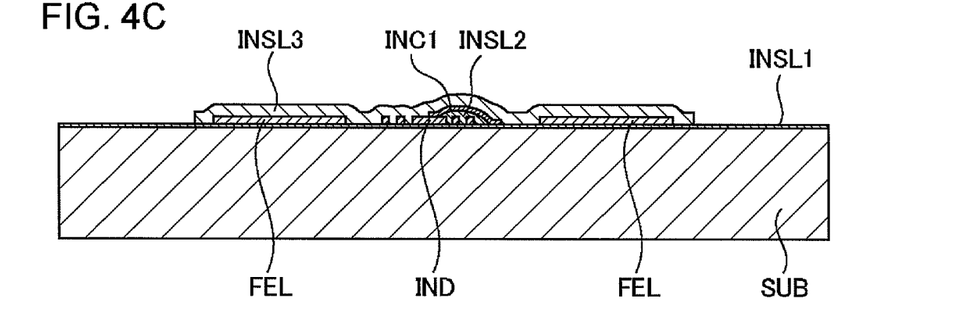

Subsequently, as shown in FIG. 4C, the insulation layer INSL3 is formed on the insulation layer INSL1, the inductor IND, the fixed electrodes FEL, the electrodes EL1, EL2 and EL4, and each of the wirings. The insulation layer INSL2 is formed using, for example, a deposition method or an application method. Subsequently, a resist pattern (not shown in the drawing) is formed on the insulation layer INSL2, and unnecessary portions of the insulation layer INSL2, for example, a portion in which the connecting section CNC should be formed and portions over the electrodes EL1, EL2 and EL4, are removed using the resist pattern as a mask. Thereafter, the resist pattern is removed.

Figure 5A:
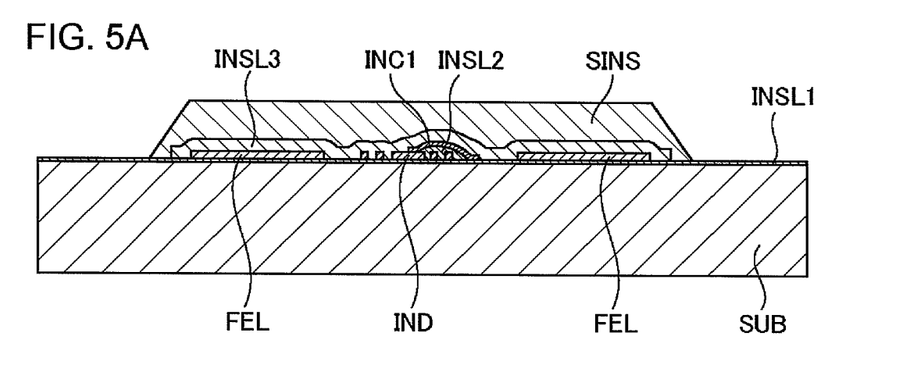
FIGS. 5A and 5B are views illustrating an example of the inductor device manufacturing method.

Subsequently, as shown in FIG. 5A, a sacrifice insulation film SINS is formed on a region which overlaps with the inductor IND and the fixed electrodes FEL in a planar view. The sacrifice insulation film SINS is formed of a material in which an etching selection ratio can be taken between the insulation layer INSL1 and the insulation layer INSL3. Subsequently, unnecessary portions of the sacrifice insulation film SINS and a portion in which the connecting section CNC should be formed are removed.

Figure 5B:
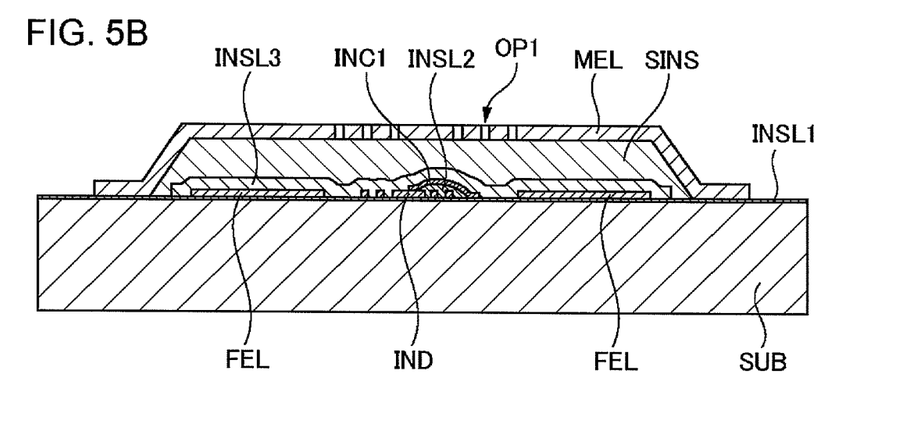

Subsequently, as shown in FIG. 5B, a conductive film is formed on the sacrifice insulation film SINS and the insulation layer INSL1. Subsequently, a resist pattern (not shown in the drawing) is formed on the conductive film, and the conductive film is selectively removed using the resist pattern as a mask. Therefore, the movable electrode MEL, the connecting section CNC, the electrode EL3, and the wiring which connects the connecting section CNC with the electrode EL3 are formed.

Thereafter, the resist pattern is removed, and the sacrifice insulation film SINS is removed using a wet etching method. In this manner, the inductor device ID is formed.

Subsequently, an advantage of the embodiment will be described. According to the embodiment, the movable electrode MEL overlaps with the inductor IND in a planar view. Therefore, when current flows through the inductor IND, overcurrent is generated in the movable electrode MEL. Accordingly, the inductance value of the inductor IND is changed depending on the distance between the inductor IND and the movable electrode MEL. Further, when a voltage is supplied between the electrode EL3 and electrode EL4, the distance between the inductor IND and the movable electrode MEL is changed. Accordingly, when an appropriate voltage is supplied between the electrode EL3 and the electrode EL4, it is possible to set the inductance value of the inductor IND to a desired value.

In addition, since the first openings OP1 are formed in the movable electrode MEL, air resistance which is applied to the movable electrode MEL decreases when the movable electrode MEL is moved. Accordingly, it is possible to suppress the vertical operation of the movable electrode MEL from being difficult or the delay of the operation of the movable electrode MEL from occurring.

In addition, the first openings OP1 are provided along the edges of the polygons which are concentric to the inductor IND. Therefore, it is possible to suppress the overcurrent which is generated in the movable electrode MEL from obstructing the first openings OP1. Accordingly, even when the first openings OP1 are formed, an ability of regulating the inductance value performed by the movable electrode MEL hardly deteriorates.

In addition, the first openings OP1 are provided in a multiplexed manner. Accordingly, when the movable electrode MEL is moved, air resistance which is applied to the movable electrode MEL further decreases.

Figure 6:
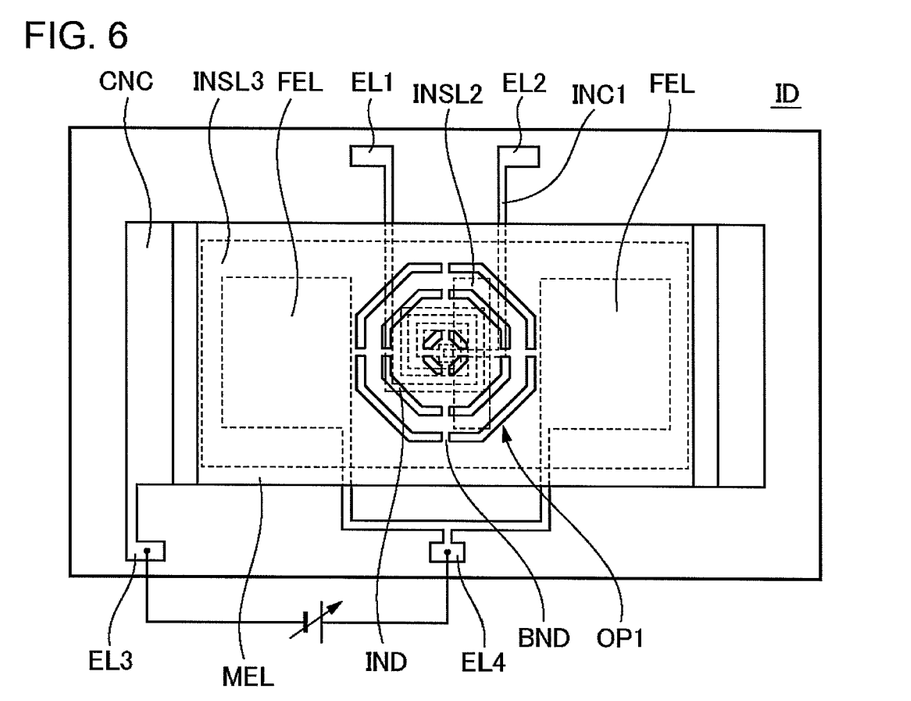
FIG. 6 is a plane view illustrating a modification example of FIG. 3.
Figure 7:
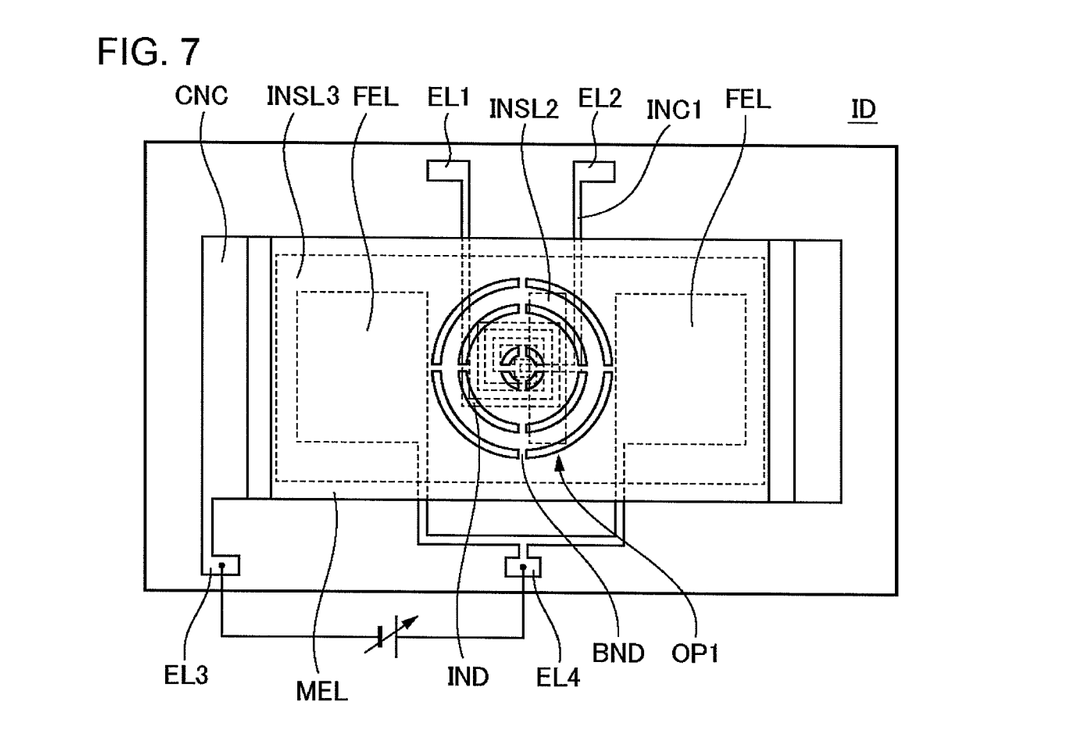
FIG. 7 is a plane view illustrating the modification example of FIG. 3.

Meanwhile, the planar layout of the first openings OP1 is not limited to the example shown in the drawing. For example, as shown in FIG. 6, the first openings OP1 may be provided along the edges of regular octagons. In addition, as shown in FIG. 7, the first openings OP1 may be provided along circumferences.

Second Embodiment

Figure 8:
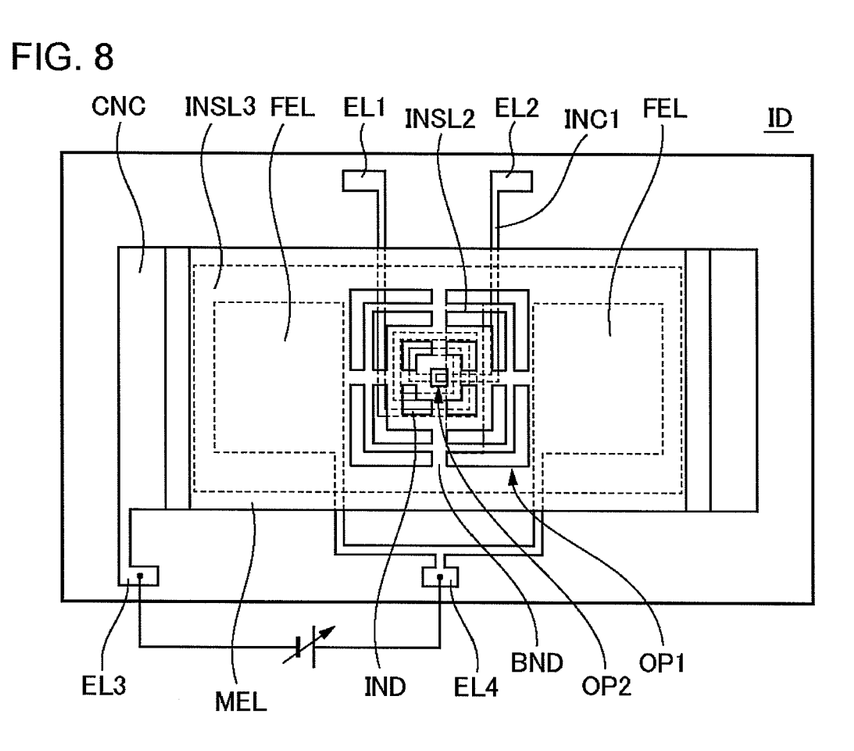
FIG. 8 is a plane view illustrating the configuration of an inductor device according to a second embodiment.
Figure 9:
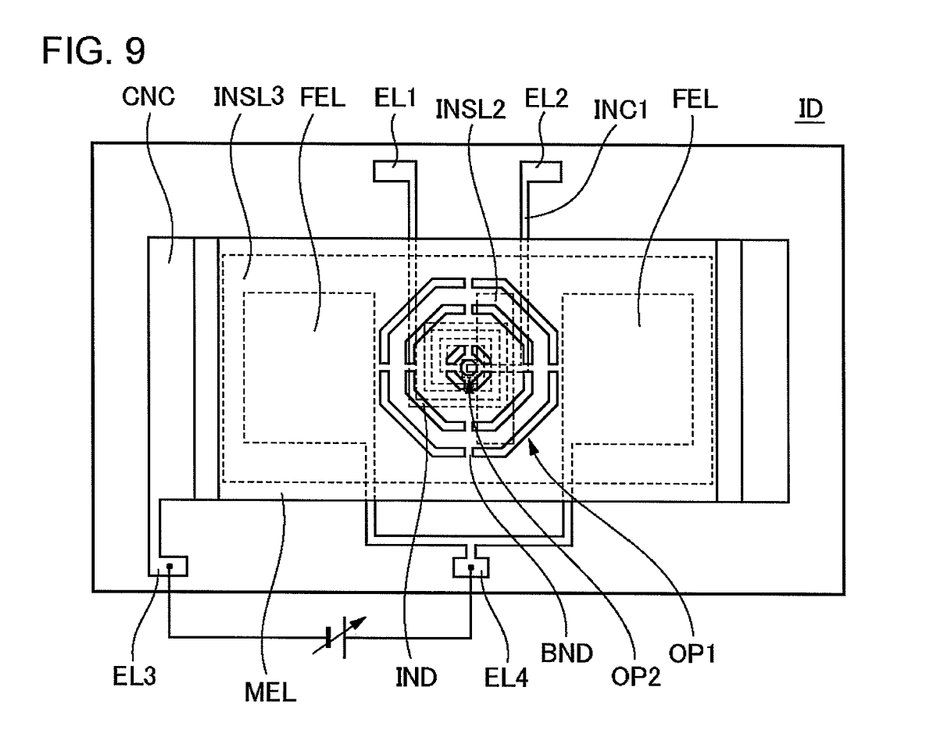
FIG. 9 is a plane view illustrating the configuration of the inductor device according to the second embodiment.
Figure 10:
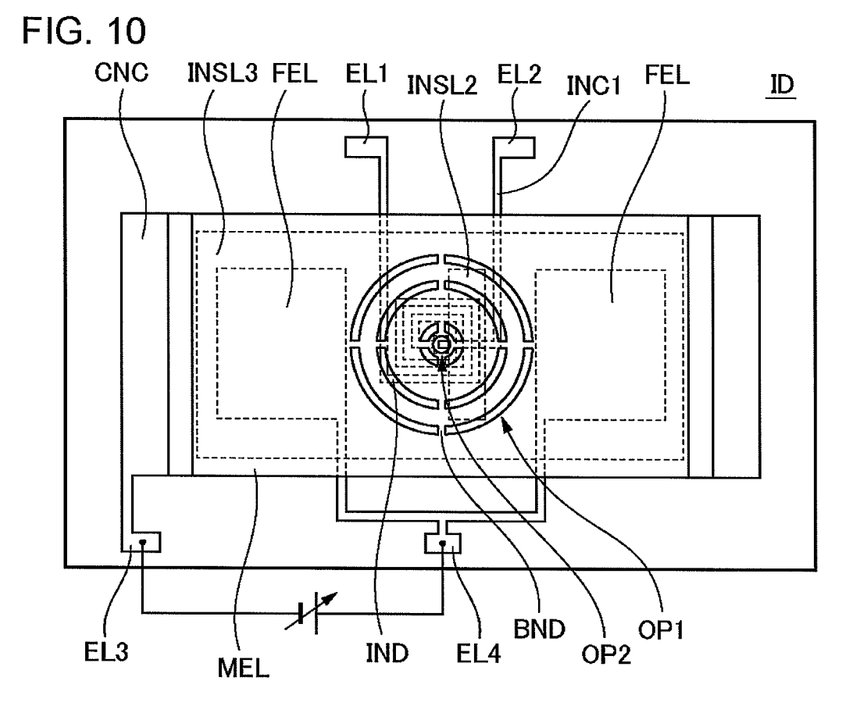
FIG. 10 is a plane view illustrating the configuration of the inductor device according to the second embodiment.

FIGS. 8, 9, and 10 are plane views illustrating the configuration of an inductor device ID according to a second embodiment. The inductor device ID according to the embodiment has the same configuration as that of the inductor device ID according to the first embodiment except that second opening OP2 is included. The second opening OP2 is formed at the same timing as the first opening OP1, and overlaps with the center of the inductor IND in a planar view.

According to the embodiment, it is possible to acquire the same advantage as in the first embodiment. In addition, since the second opening OP2 is provided, it is possible to further decrease resistance which is applied to the movable electrode MEL when the movable electrode MEL is moved. In addition, since the second opening OP2 overlaps with the center of the inductor IND, it is possible to suppress the generation of overcurrent in the movable electrode MEL from being difficult even when the second opening OP2 is formed.

Third Embodiment

Figure 11:
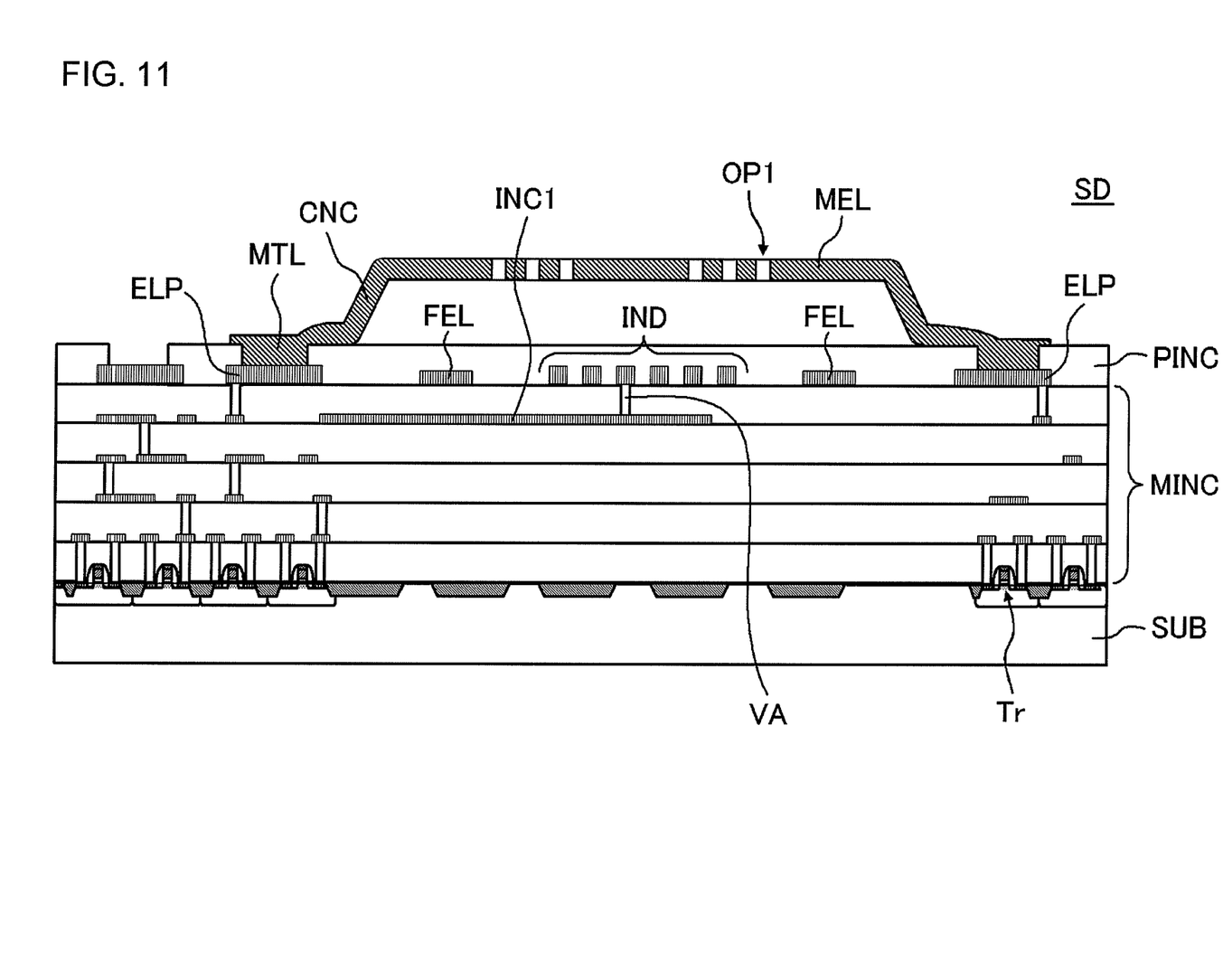
FIG. 11 is a cross-sectional view illustrating the configuration of a semiconductor device according to a third embodiment.

FIG. 11 is a cross-sectional view illustrating the configuration of a semiconductor device SD according to a third embodiment. The semiconductor device SD according to the embodiment includes a substrate SUB, transistors Tr (semiconductor elements), a multi-wiring layer MINC, an inductor IND, fixed electrodes FEL, and a movable electrode MEL. The substrate SUB is a semiconductor substrate. The transistors Tr are formed on the substrate SUB. The relative positions of the inductor IND, the fixed electrodes FEL and the movable electrode MEL, and the layout of the openings (the first openings OP1 and the second opening OP2) which are formed in the movable electrode MEL are the same as those of the inductor devices ID which are shown in the first embodiment and the second embodiment.

In the embodiment, the fixed electrodes FEL are formed using any wiring layer in the multi-wiring layer MINC, and the inductor IND is formed in any wiring layer of the multi-wiring layer MINC. In an example shown in the drawing, all of the fixed electrodes FEL and the inductor IND are formed in the same wiring layer, more specifically, in a top wiring layer. Electrode pads ELP are also formed in the top wiring layer. Further, the fixed electrodes FEL and the inductor IND are covered by a protective insulation film PINC. The protective insulation film PINC is, for example, a silicon nitride film, a silicon oxynitride film, or a laminated film acquired by laminating the silicon oxide film and the silicon nitride film. In addition, a wiring INC1 is formed using any wiring layer of the multi-wiring layer MINC. In the example shown in the drawing, the wiring INC1 is positioned in a wiring layer which is below the inductor IND, and is connected to an end of the central side of the inductor IND through a via VA.

The semiconductor device SD includes a control circuit CNT (which will be described later) which controls the motion of the movable electrode MEL. The circuit is formed using the transistors Tr. Further, the movable electrode MEL and the fixed electrodes FEL are connected to the control circuit CNT through the multi-wiring layer MINC.

In addition, the connecting sections CNC of the movable electrode MEL are connected to either of the electrode pads ELP through conductors MTL. In the example shown in the drawing, all of the connecting sections CNC at both the ends of the movable electrode MEL are respectively connected to the electrode pads ELP through the conductors MTL. The conductors MTL are, for example, copper, and are positioned in openings which are formed in the protective insulation film PINC.

A method of manufacturing the semiconductor device SD according to the embodiment is as follows. First, an element separation film is formed on the substrate SUB. Therefore, element formation regions are acquired through separation. Although the element separation film is formed using, for example, an STI method, the element separation film may be formed using a LOCOS method. Subsequently, a gate insulation film and a gate electrode are formed on a semiconductor substrate which is positioned in the element formation region. The gate insulation film may be a silicon oxide film or may be a high permittivity film (for example, a hafnium silicate film) which has higher permittivity than the silicon oxide film. When the gate insulation film is the silicon oxide film, the gate electrode is formed of a polysilicon film. In addition, when the gate insulation film is the high permittivity film, the gate electrode is formed of a laminated film of a metal film (for example, TiN) and the polysilicon film. In addition, when the gate electrode is formed of polysilicon, a polysilicon resistor may be formed on the element separation film in a process to form the gate electrode.

Subsequently, a source and drain extension region is formed on the semiconductor substrate which is positioned in the element formation region. Subsequently, side walls are formed on the side walls of the gate electrode. Subsequently, an impurity region which includes the source and the drain is formed on the semiconductor substrate which is positioned in the element formation region. In this manner, the transistors Tr are formed on the semiconductor substrate. Meanwhile, in a process to form the gate electrode, there is a case in which a polysilicon resistor is formed on the element separation film.

Subsequently, the multi-wiring layer MINC is formed on the element separation film and the transistors Tr. At this time, the electrode pads ELP, the fixed electrodes FEL, and the inductor IND are formed. Subsequently, the protective insulation film PINC is formed on the multi-wiring layer MINC. The openings which are positioned at the electrode pads ELP are formed in the protective insulation film PINC.

Subsequently, the movable electrode MEL and the conductors MTL are formed on the protective insulation film PINC. The movable electrode MEL is formed on the protective insulation film PINC by forming the sacrifice insulation film SINS described in the first embodiment.

Figure 12:
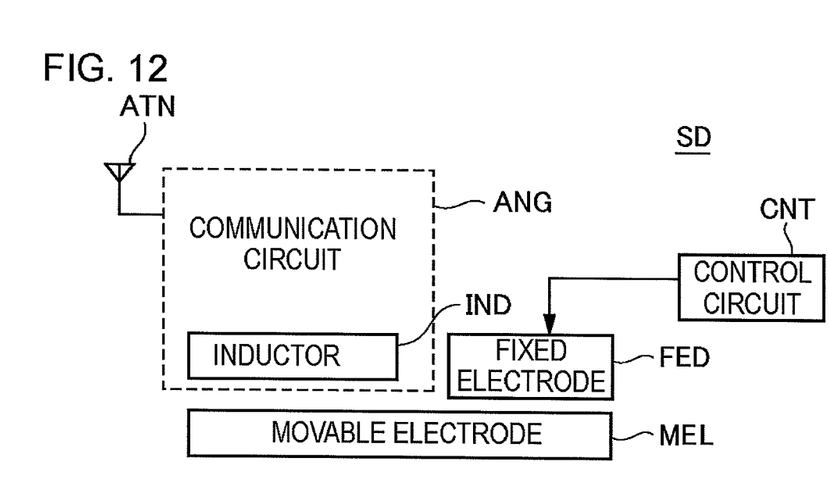
FIG. 12 is a view illustrating an example of a circuit which includes the semiconductor device.

FIG. 12 is a view illustrating an example of a circuit which is included in the semiconductor device SD. In the example shown in the drawing, the inductor IND is a part of a communication circuit ANG. The communication circuit ANG is connected to an antenna ATN. The antenna ATN is provided on the outside of the semiconductor device SD. Further, the communication frequency of the communication circuit ANG is changed by changing the inductance value of the inductor IND.

In the embodiment, it is possible to acquire the same advantage as in the first and second embodiments. In addition, it is possible to form the inductor IND, the circuit which includes the inductor IND, the fixed electrodes FEL, the movable electrode MEL, and the control circuit CNT using a single substrate SUB.

In addition, all of the fixed electrodes FEL and the inductor IND are formed in the wiring layer in which the electrode pads ELP are formed. Accordingly, it is possible to shorten the distance between the fixed electrodes FEL and the inductor IND, and the movable electrode MEL.

It is apparent that the present invention is not limited to the above embodiment, and may be modified and changed without departing from the scope and spirit of the invention.

What is claimed is:

1. An inductor device comprising:
an insulation layer;
an inductor that is formed over the insulation layer;
fixed electrodes that are provided in positions which do not overlap with the inductor in a planar view; and
a movable electrode that is configured to overlap with the inductor and the fixed electrodes in the planar view, that is separated from the inductor and the fixed electrodes, and that is configured to include first openings.

2. The inductor device according to claim 1,
wherein the first openings are formed along edges of a circle or a polygon which is concentric to the inductor in the planar view.

3. The inductor device according to claim 2,
wherein the first openings are formed in a multiplexed manner in the planar view.

4. The inductor device according to claim 2,
wherein the movable electrode includes a second opening that overlaps with a center of the inductor.

5. A semiconductor device comprising:
a substrate;
semiconductor elements that are formed over the substrate;
a multi-wiring layer that is formed over the substrate and the semiconductor elements;
an inductor that is formed in any wiring layer of the multi-wiring layer;
fixed electrodes that are formed in any wiring layer of the multi-wiring layer and that do not overlap with the inductor in a planar view; and
a movable electrode that is positioned over an upper side of the multi-wiring layer, that is configured to overlap with the inductor and the fixed electrodes in the planar view, and that is configured to include first openings.

6. The semiconductor device according to claim 5, further comprising:
electrode pads that are formed in the multi-wiring layer,
wherein the inductor and the fixed electrode are formed in a same layer as the electrode pads.

7. The semiconductor device according to claim 5,
wherein the first openings are formed along edges of circles or polygons that are concentric to the inductor in the planar view.

8. The semiconductor device according to claim 7,
wherein the first openings are formed in a multiplexed manner in the planar view.

9. The semiconductor device according to claim 7,
wherein the movable electrode includes a second opening that overlaps with a center of the inductor.

* * * * *